US010332791B2

(12) United States Patent
Jeon et al.

(10) Patent No.: US 10,332,791 B2
(45) Date of Patent: Jun. 25, 2019

(54) SEMICONDUCTOR DEVICE WITH A CONDUCTIVE LINER

(71) Applicant: SAMSUNG ELECTRONICS CO., LTD., Suwon-si, Gyeonggi-Do (KR)

(72) Inventors: Ho-Yun Jeon, Hwaseong-si (KR); Rak-Hwan Kim, Suwon-si (KR); Byung-Hee Kim, Seoul (KR); Kyoung-Hee Nam, Seoul (KR); Jong-Jin Lee, Seoul (KR); Jae-Won Hwang, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/805,865

(22) Filed: Nov. 7, 2017

(65) Prior Publication Data
US 2018/0158730 A1 Jun. 7, 2018

(30) Foreign Application Priority Data

Dec. 2, 2016 (KR) .......................... 10-2016-0163432

(51) Int. Cl.
H01L 21/768 (2006.01)
H01L 23/532 (2006.01)
(Continued)

(52) U.S. Cl.
CPC .... *H01L 21/76865* (2013.01); *H01L 21/7681* (2013.01); *H01L 21/76816* (2013.01);
(Continued)

(58) Field of Classification Search
CPC ......... H01L 23/53204; H01L 23/53209; H01L 23/53214; H01L 23/53219;
(Continued)

(56) References Cited

U.S. PATENT DOCUMENTS 7,951,708 B2   5/2011  Dehaven et al.
7,956,463 B2   6/2011  Yang et al.
(Continued)

FOREIGN PATENT DOCUMENTS

KR   10-2002-0006362   1/2002
KR   10-2003-0008067   1/2003
KR   10-2009-0045677   5/2009

*Primary Examiner* — Sonya D. McCall-Shepard
(74) *Attorney, Agent, or Firm* — F. Chau & Associates, LLC

(57) ABSTRACT

A semiconductor device includes an insulating interlayer disposed on a substrate, a first protection pattern, a first barrier pattern, a first adhesion pattern, and a first conductive pattern. The insulating interlayer includes a via hole and a first trench. The via hole extends through a lower portion of the insulating interlayer. The first trench is connected to the via hole and extends through an upper portion of the insulating interlayer. The first protection pattern covers a lower surface and sidewalls of the via hole and a portion of a lower surface and a lower sidewall of the first trench, and includes a conductive material. The first barrier pattern covers the protection pattern and an upper sidewall of the first trench. The first adhesion pattern covers the first barrier pattern. The first conductive pattern is disposed on the first adhesion pattern, and fills the via hale and the first trench.

15 Claims, 9 Drawing Sheets

(51) Int. Cl.
*H01L 21/288* (2006.01)
*H01L 23/528* (2006.01)
*H01L 23/522* (2006.01)
*H01L 21/285* (2006.01)

(52) U.S. Cl.
CPC .. *H01L 21/76846* (2013.01); *H01L 21/76877* (2013.01); *H01L 23/5226* (2013.01); *H01L 23/5283* (2013.01); *H01L 23/53223* (2013.01); *H01L 23/53238* (2013.01); *H01L 21/2855* (2013.01); *H01L 21/2885* (2013.01); *H01L 21/28556* (2013.01); *H01L 21/7684* (2013.01); *H01L 21/76873* (2013.01)

(58) Field of Classification Search
CPC ......... H01L 23/53223; H01L 23/53228; H01L 23/53233; H01L 23/53238; H01L 23/53257; H01L 23/53261; H01L 23/53266; H01L 23/5329; H01L 21/76802; H01L 21/76807; H01L 21/76808; H01L 21/7681
See application file for complete search history.

(56) References Cited

U.S. PATENT DOCUMENTS

| | | | |
|---|---|---|---|
| 7,981,791 | B2 | 7/2011 | Haukka et al. |
| 9,238,299 | B2 | 1/2016 | Zhang et al. |
| 9,396,988 | B2 | 7/2016 | Lee et al. |
| 2009/0001577 | A1 | 1/2009 | Kim et al. |
| 2015/0270156 | A1* | 9/2015 | Lin ...................... H01L 21/743 257/622 |
| 2016/0027896 | A1 | 1/2016 | Lee et al. |
| 2016/0307845 | A1* | 10/2016 | Furuhashi ......... H01L 21/76835 |

* cited by examiner

SEMICONDUCTOR DEVICE WITH A CONDUCTIVE LINER

CROSS-REFERENCE TO RELATED APPLICATION

This application claims priority under 35 U.S.C. § 119 to Korean Patent Application No. 10-2016-0163432, filed on Dec. 2, 2016 in the Korean Intellectual Property Office, the disclosure of which is incorporated by reference herein in its entirety.

TECHNICAL FIELD

Exemplary embodiments of the present inventive concept relate to semiconductor devices, and more particularly to semiconductor devices including wirings.

DISCUSSION OF RELATED ART

In a damascene process for forming wirings, an insulating interlayer may be etched using a hard mask as an etching mask to form a trench and/or a via hole. A conductive layer may be formed to fill the trench and/or the via hole. When the conductive layer is formed without removing the hard mask, an aspect ratio may increase. As a result, the conductive layer might not completely fill the trench and/or the via hole. Thus, the hard mask may be removed before forming the conductive layer, however, the underlying wirings may be partially removed.

SUMMARY

Exemplary embodiments of the present inventive concept provide a semiconductor device. The semiconductor device includes an insulating interlayer, a first protection pattern, a first barrier pattern, a first adhesion pattern, and a first conductive pattern. The insulating interlayer is disposed on a substrate. The insulating interlayer includes a via hole and a first trench. The via hole extends through a lower portion of the insulating interlayer. The first trench is connected to the via hole. The first trench extends through an upper portion of the insulating interlayer. The first protection pattern covers a lower surface and sidewall of the via hole and a portion of a lower surface and a lower sidewall of the first trench. The first protection pattern includes a conductive material. The first barrier pattern covers the protection pattern and an upper sidewall of the first trench. The first adhesion pattern covers the first barrier pattern. The first conductive pattern is disposed can the first adhesion pattern. The first conductive pattern fills the via hole and the first trench.

Exemplary embodiments of the present inventive concept provide a semiconductor device. The semiconductor device includes a first wiring structure and a second wiring structure. The first wiring structure includes a first barrier pattern, a first adhesion pattern, a first conductive pattern, and a first protection pattern. The first adhesion pattern covers an upper surface of the first barrier pattern. The first conductive pattern is disposed on the first adhesion pattern. The first protection pattern covers at least a portion of a lower surface of the barrier pattern. The first protection pattern includes a conductive material. The second wiring structure includes a second barrier pattern, a second adhesion pattern, and a second conductive pattern. The second adhesion pattern covers an upper surface of the second barrier pattern. The second conductive pattern is disposed on the second adhe-sion pattern. A lower surface and a sidewall of the first conductive pattern are covered by the first adhesion pattern, and a lower surface and a sidewall of the second conductive pattern are covered by the second adhesion pattern. A lower surface of the first wiring structure is lower than a lower surface of the second wiring structure. An upper surface of the first wiring structure may be substantially coplanar with an upper surface of the second wiring structure.

BRIEF DESCRIPTION OF THE DRAWINGS

Exemplary embodiments of the present inventive concept will be more dearly understood from the following detailed description taken in conjunction with the accompanying drawings, in which.

DETAILED DESCRIPTION OF THE EMBODIMENTS

FIGS. 1 to 7 are cross-sectional views illustrating a method of manufacturing a semiconductor device according to an exemplary embodiment of the present invention.

Figure 1:
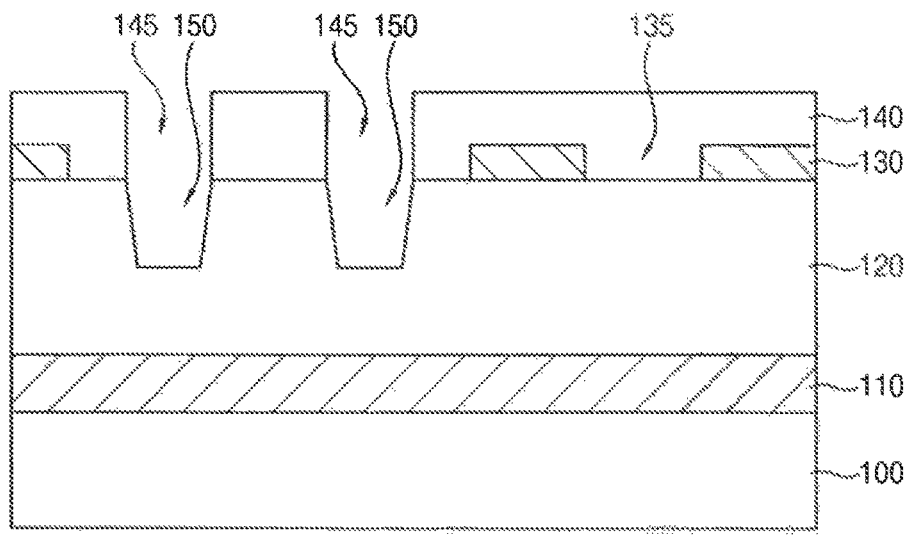
FIGS. 1 to 7 are cross-sectional views illustrating a method of manufacturing a semiconductor device according to an exemplary embodiment of the present inventive concept.

Referring to FIG. 1, a first wiring 110 and a second insulating interlayer 120 may be sequentially formed on a substrate 100. A first mask 130 and a second mask 140 may be sequentially formed on the second insulating interlayer 120.

The substrate 100 may include a semiconductor material, e.g., silicon, germanium, silicon-germanium, or III-V semiconductor compounds, e.g., Gap, GaAs, or GaSb. According to an exemplary embodiment of the present inventive concept, the substrate 100 may be a silicon-on-insulator (SOI) substrate or a germanium-on-insulator (GOI) substrate.

Various types of elements, e.g., a gate structure, a source/drain layer, a contact plug, a wiring, or a via, may be formed on the substrate 100. The various types of demerits described above may be covered by an insulation layer.

According to an exemplary embodiment of the present inventive concept, the first wiring 110 may be formed by forming a first opening in a first insulating interlayer on the substrate 100. A first conductive layer may be formed on the first insulating interlayer and may fill the first opening. The first conductive layer may be planarized until an upper surface of the first insulating interlayer is exposed. The first conductive layer may include a metal or a metal nitride. The first insulating interlayer may include, e.g., silicon oxide or a low-k dielectric material having a dielectric constant lower than a dielectric constant of silicon oxide. The planarization process may be performed by a chemical mechanical polishing (CMP) process and/or an etch back process.

The second insulating interlayer 120 may include silicon dioxide or a low-k dielectric material including silicon oxide and having a dielectric constant lower than a dielectric constant of silicon dioxide, e.g., silicon oxide doped with carbon (SiCOH), silicon oxide doped with fluorine (F—SiO$_2$), a porous silicon oxide, etc.

The first and second masks 130 and 140 may include second and third openings 135 and 145, respectively. The first and second masks 130 and 140 may partially overlap with each other.

The first mask 130 may include a metal nitride, e.g., titanium nitride, tantalum nitride, etc. The second mask 140 may include an insulating material, e.g., silicon oxynitride, silicon nitride, etc.

The second insulating interlayer 120 may be etched using the first and second masks 130 and 140 as an etching mask. Thus, a first recess 150 may be formed. According to an exemplary embodiment of the present inventive concept, the etching process may be performed only on an upper portion of the second insulating interlayer 120. Thus, the first recess 150 may extend through the upper portion of the second insulating interlayer 120. According to an exemplary embodiment of the present inventive concept, the first recess 150 may be formed at an area where the second and third openings 135 and 145 overlap with each other.

Figure 2:
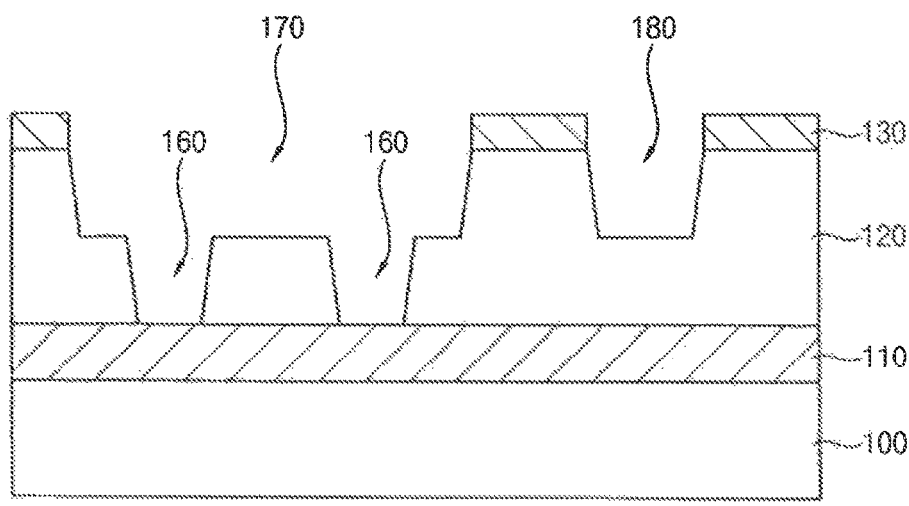

Referring to FIG. 2, after the second mask 140 is removed, the second insulating interlayer 120 may be etched using the first mask 130 as an etching mask. Thus, a via hole 160 and first and second trenches 170 and 180 may be formed.

According to an exemplary embodiment of the present inventive concept, the etching process may be performed until an upper surface of the first wiring 110 under the second insulating interlayer 120 is exposed. Thus, the via hole 160 may expose the upper surface of the first wiring 110. The via hole 160 may be formed below the first recess 150.

The first and second trenches 170 and 180 may be formed below the second opening 135 of the first mask 130. The first and second trenches 170 and 180 may extend through an upper portion of the second insulating interlayer 120. The first trench 170 may be connected or in communication with the underlying via hole 160. According to an exemplary embodiment of the present inventive concept, lower surfaces of the first and second trenches 170 and 180 may be substantially coplanar with each other.

FIG. 2 illustrates two via holes 160 connected to the first trench 170; however, exemplary embodiments of the present inventive concept is not limited thereto. The number of the via holes 160 connected to the first trench 170 may be variously changed.

Figure 3:
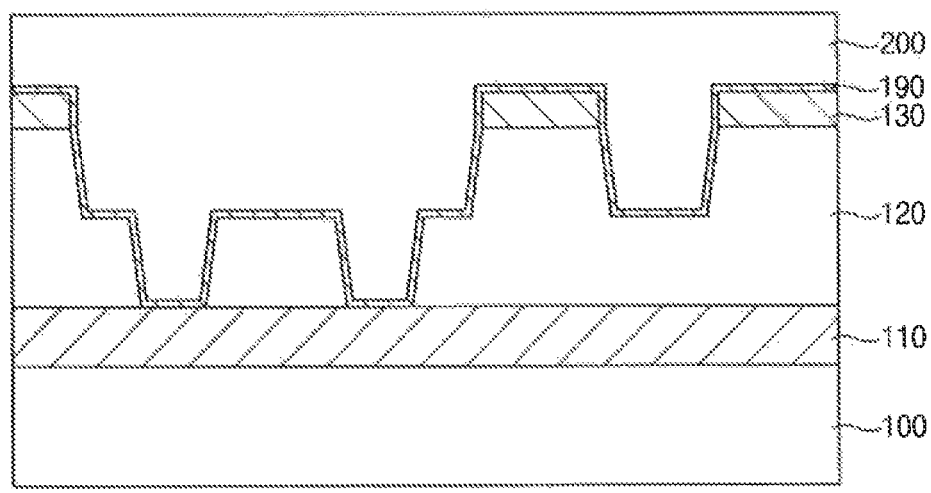

Referring to FIG. 3, a protection layer 190 may be formed on the exposed upper surface of the first wiring 110, a sidewall of the via hole 160, lower surfaces and sidewalls of the first and second trenches 170 and 180, and an upper surface of the first mask 130. A sacrificial layer 200 may be formed on the protection layer 190. The sacrificial layer 200 may fill the via hole 160 and the first and second trenches 170 and 180.

According to an exemplary embodiment of the present inventive concept, the sacrificial layer 200 may include a material that may be removed with relative ease. For example, the sacrificial layer 200 may include a spin-on hardmask (SOH), amorphous carbon layer (ACL), etc.

According to an exemplary embodiment of the present inventive concept, the protection layer 190 may be formed by an atomic layer deposition (ALD) process. The ALD process may have a high step coverage. Thus, the protection layer 190 may be formed with relative ease on the sidewall of the via hole 160 and the sidewalls of the first and second trenches 170 and 180.

The protection layer 190 may include a conductive material having a high etching selectivity with respect to the sacrificial layer 200. For example, the protection layer 190 may include a metal nitride, e.g., titanium nitride, manganese nitride, etc., or a metal, e.g., titanium, tantalum, manganese, etc. Thus, when the protection layer 190 includes titanium nitride, the protection layer 190 may be merged with the underlying first mask 130.

Figure 4:
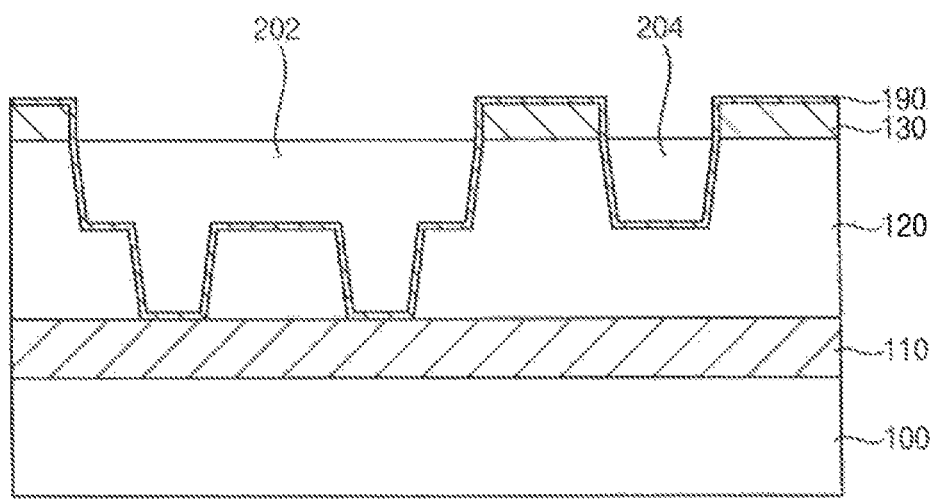

Referring to FIG. 4, an upper portion of the sacrificial layer 200 may be removed to partially expose the protection layer 190. A first sacrificial pattern 202 may be formed in the via hole 160 and the first trench 170. A second sacrificial pattern 204 may be formed in the second trench 180.

According to an exemplary embodiment of the present inventive concept, the upper portion of the sacrificial layer 200 may be removed by an etch back process. Upper surfaces of the first and second sacrificial patterns 202 and 204 may be substantially coplanar with an upper surface of the second insulating interlayer 120.

Figure 5:
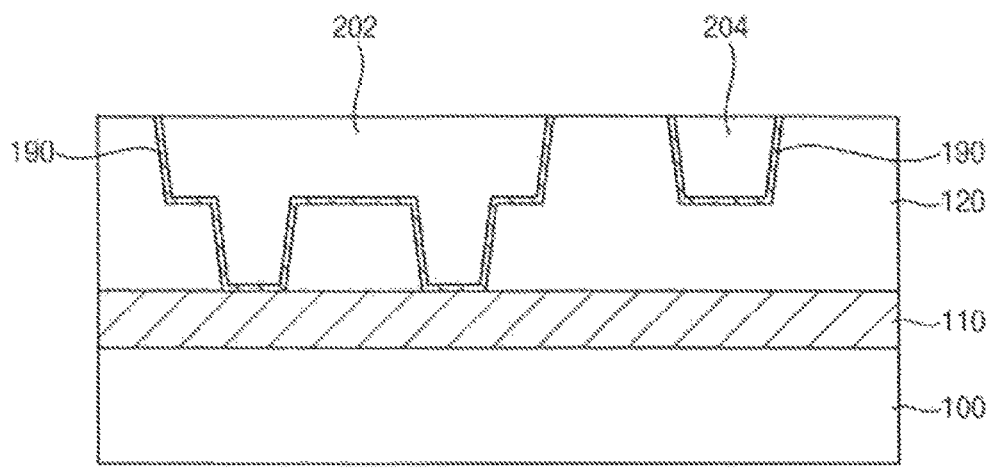

Referring to FIG. 5, the exposed portion of the protection layer 190 and the first mask 130 may be removed.

According to an exemplary embodiment of the present inventive concept, the protection layer 190 and the first mask 130 may be removed by a wet etching process. The protection layer 190 may include a material having a high etching selectivity with respect to an etching selectivity of the first and second sacrificial patterns 202 and 204. The first mask 130 may include a metal nitride, e.g., titanium nitride. Thus, the first mask 130 may have a high etching selectivity with respect to an etching selectivity of the first and second sacrificial patterns 202 and 204, which may include, e.g., spin-on hardmask (SOH).

Thus, when the protection layer 190 and the first mask 130 are removed, the first and second sacrificial patterns 202 and 204 might not be removed. Thus, a portion of the protection layer 190 covered by the first and second sacrificial patterns 202 and 204 might not be removed. Thus, an upper surface of the first wiring 110 covered by the portion of the protection layer 190 may be protected.

Figure 6:
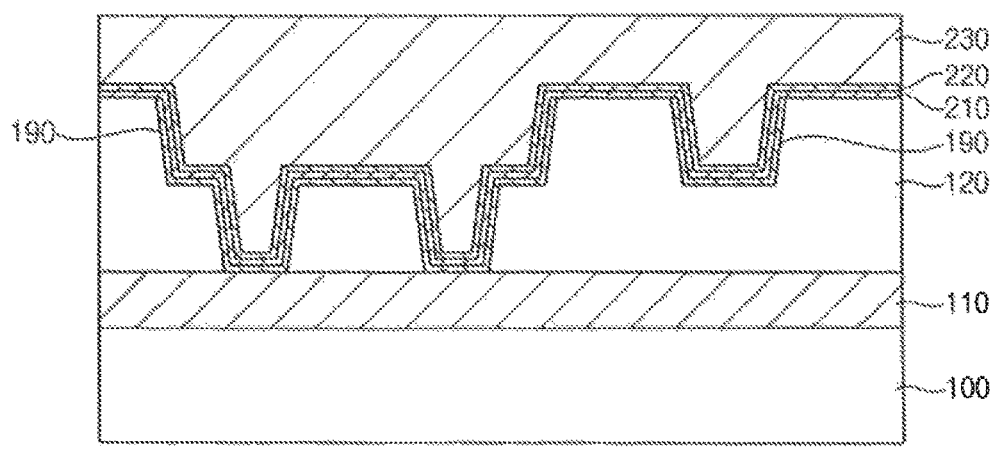

Referring to FIG. 6, the first and second sacrificial patterns 202 and 204 may be removed to expose an upper surface of the protection layer 190. A barrier layer 210 and an adhesion layer 220 may be sequentially formed on the exposed upper surface of the protection layer 190 and the upper surface of the second insulating interlayer 120. A second conductive layer 230 may be formed on the adhesion layer 220. The second conductive layer 230 may fill the via hole 160 and the first and second trenches 170 and 180.

According to an exemplary embodiment of the present inventive concept, the first and second sacrificial patterns 202 and 204 may be removed by an ashing process and/or a stripping process. The protection layer 190 may include a material having a high etching selectivity with respect to an etching selectivity of the first and second sacrificial patterns 202 and 204. Thus, the protection layer 190 might not be removed by the above process.

The barrier layer 210 may include a metal nitride, e.g., tantalum nitride, titanium nitride, etc. The adhesion layer 220 may include a metal, e.g., cobalt, ruthenium, etc. The second conductive layer 230 may include a metal, e.g., copper, aluminum, etc.

The barrier layer 210 may prevent or reduce a metal component from the second conductive layer 230 from diffusing into the second insulating interlayer 120. The adhesion layer 220 may increase adhesion between the second conductive layer 230 and the barrier layer 210. According to an exemplary embodiment of the present inventive concept, the adhesion layer 220 might not be formed.

According to an exemplary embodiment of the present inventive concept, the barrier layer 210 may be formed by a physical vapor deposition (PVD) process, e.g., a sputtering process. The PVD process may have a high step coverage. Thus, the barrier layer 210 might not be easily formed on the sidewall of the via hole 160 and the sidewalls of the first and second trenches 170 and 180.

However, the protection layer 190 may be formed on the sidewall of the via hole 160 and the sidewalls of the first and second trenches 170 and 180. Thus, the adhesion layer 220 may be easily formed on the protection layer 190. As a result, the second conductive layer 230 may be easily formed on the sidewall of the via hole 160 and the sidewalls of the first and second trenches 170 and 180, for example, with no void therein.

The second insulating interlayer 120 may be covered by the protection layer 190. When a bias voltage is applied during the sputtering process for forming the barrier layer 210, the second insulating interlayer 120 might not be damaged. Additionally, the dielectric constant of the second insulating interlayer 120 might not increase.

According to an exemplary embodiment of the present inventive concept, the second conductive layer 230 may be formed by forming a seed layer on the adhesion layer 220, and performing an electroplating process. When the seed layer is formed, a bias voltage may be applied. The second insulating interlayer 120 may be covered by the protection layer 190, the barrier layer 210, and the adhesion layer 220. Thus, the dielectric constant of the second insulating interlayer 120 might not increase.

Figure 7:
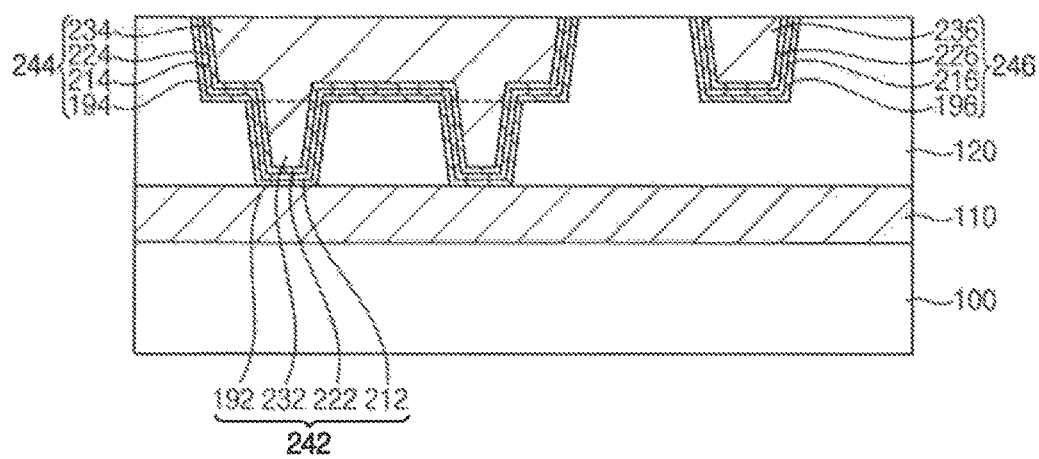

Referring to FIG. 7, upper portions of the second conductive layer 230, the adhesion layer 220, and the barrier layer 210 may be removed to form a via 242 and second and third wirings 244 and 246.

According to an exemplary embodiment of the present inventive concept, a CMP process and/or an etch back process may be performed, for example, until the upper surface of the second insulating, interlayer 120 is exposed.

The via 242 may include a first protection pattern 192, a first barrier pattern 212, a first adhesion pattern 222, and a first conductive pattern 232. The first protection pattern 192, the first barrier pattern 212, the first adhesion pattern 222, and the first conductive pattern 232 may be sequentially stacked in the via hole 160. The second wiring 244 may include a second protection pattern 194, a second barrier pattern 214, a second adhesion pattern 224, and a second conductive pattern 234. The second protection pattern 194, the second barrier pattern 214, the second adhesion pattern 224, and the second conductive pattern 234 may be sequentially stacked in the first trench 170. The third wiring 246 may include a third protection pattern 196, a third barrier pattern 216, a third adhesion pattern 226, and a third conductive pattern 236. The third protection pattern 196, the third barrier pattern 216, the third adhesion pattern 226, and the third conductive pattern 236 may be sequentially stacked in the second trench 180.

The first and second protection patterns 192 and 194 may contact each other and may be integrally formed. The first and second barrier patterns 212 and 214 may contact each other and may be integrally formed. The first and second adhesion patterns 222 and 224 may contact each other and may be integrally formed. The first and second conductive patterns 232 and 234 may contact each other and may be integrally formed. The via 242 and the second wiring 244 may be sequentially stacked on the first wiring 110. The via 242 and the second wiring 244 may contact each other.

The first protection pattern 192 may be formed on the lower surface and the sidewall of the via hole 160. The third protection pattern 196 may be formed on the lower surface and the sidewall of the second trench 180. The second protection pattern 194 may be formed on a portion of the lower surface and the sidewall of the first trench 170.

By the above processes, the semiconductor device may be manufactured.

As illustrated above, after forming the via hole 160 and the first and second trenches 170 and 180, the protection layer 190 may include a conductive material and may cover the lower surface and sidewalls of the via hole 160 and the first and second trenches 170 and 180. Thus, after removing the first mask 130, the via 242 and the second wiring 244 may be electrically connected to the underlying first wiring 110 without removal of the protection layer 190. Accordingly, damage to the first wiring 110 caused by removing the protection layer 190 may be prevented.

The protection layer 190 having a high step coverage may be formed by an ALD process on the sidewalls of the via hole 160 and the first and second trenches 170 and 180. Thus, if the barrier layer 210 is formed on the protection layer 190 by a PVD process having a low step coverage, the adhesion layer 220 and the second conductive layer 230 may be easily formed, for example, with no void therein.

Further, when the barrier layer 210 and/or the second conductive layer 230 are formed, if a bias voltage is applied, the second insulating interlayer 120 may be covered by the protection layer 190. Thus, the second insulating interlayer 120 might not be damaged and may maintain a low dielectric constant.

As a result, the semiconductor device including the first to third wirings 110, 244 and 246 and the via 242 may have increased characteristics.

The via 242 and the second wiring 244 sequentially stacked may be referred to as a wiring structure. A lower surface of the wiring structure may be lower than a lower surface of the third wiring 246. An upper surface of the wiring structure may be substantially coplanar with an upper surface of the third wiring 246. Thus, the upper surfaces of the second and third wirings 244 and 246 may be substantially coplanar with each other, and the lower surfaces of the second and third wirings 244 and 246 may be substantially coplanar with each other. The via 242 may be formed below the second wiring 244. The via 242 may contact the second wiring 244. Thus, the wiring structure including the via 242 and the second wiring 244 may have a lower surface lower than an lower surface of the third wiring 246.

Figure 8:
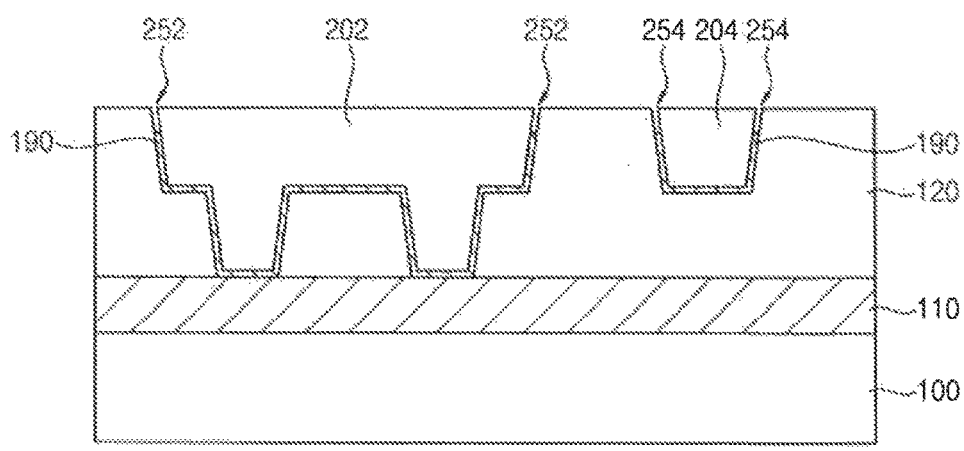
FIGS. 8 and 9 are cross-sectional views illustrating a method of manufacturing a semiconductor device according to an exemplary embodiment of the present inventive concept.
Figure 9:
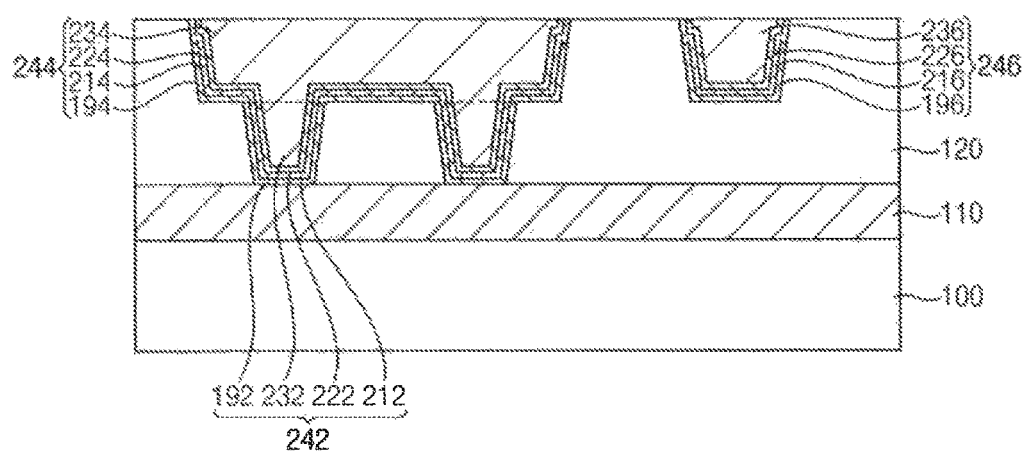

FIGS. 8 and 9 are cross-sectional views illustrating a method of manufacturing a semiconductor device according to an exemplary embodiment of the present inventive concept. The method may include processes substantially the same as or similar to those illustrated with reference to FIGS. 1 to 7, and detailed descriptions thereof may be omitted.

Processes substantially the same as or similar to those illustrated with reference to FIGS. 1 to 4 may be performed.

Referring to FIG. 8, processes substantially the same as or similar to those illustrated with reference to FIG. 5 may be performed. However, when the first mask 130 and the upper portion of the protection layer 190 are removed, a portion of the protection layer 190 adjacent upper surfaces of the first and second sacrificial patterns 202 and 204 may be further removed. Thus, an upper surface of the protection layer 190 may be lower than upper surfaces of the first and second sacrificial patterns 202 and 204. The first mask 130 and the protection layer 190 may be removed by a wet etching process. When the first mask 130 having a relatively thick thickness is completely removed, the protection layer 190 having a relatively thin thickness may be removed. As a result, a portion of the protection layer 190 below the upper surfaces of the first and second sacrificial patterns 202 and 204 may also be removed. Accordingly, second and third recesses 252 and 254 may be formed adjacent upper portions of the first and second sacrificial patterns 202 and 204, respectively.

Referring to FIG. 9, processes substantially the same as or similar to those illustrated with reference to FIGS. 6 and 7 may be performed to manufacture the semiconductor device according to an exemplary embodiment of the present inventive concept.

In the semiconductor device according to an exemplary embodiment of the present inventive concept, the second protection pattern 194 may be formed on a portion of the lower surface of the first trench 170 and a portion, e.g., a lower portion of the sidewall of the first trench 170. The third protection pattern 196 may be formed on a portion of the lower surface of the second trench 180 and a portion, e.g., a lower portion of the sidewall of the second trench 180. Thus, the second barrier pattern 214 may be formed on a remaining portion, e.g., an upper portion of the sidewall of the first trench 170, and the third barrier pattern 216 may be formed on a remaining portion, e.g., an upper portion of the sidewall of the second trench 180.

Figure 10:
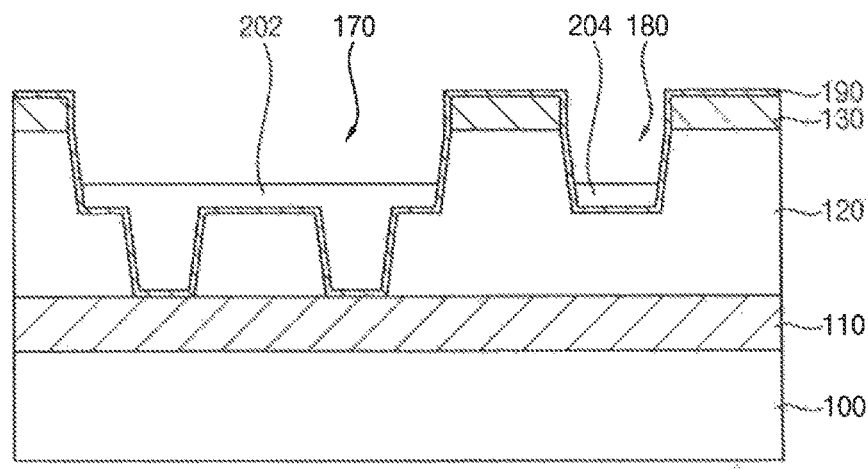
FIGS. 10 to 12 are cross-sectional views illustrating a method of manufacturing a semiconductor device according to an exemplary embodiment of the present inventive concept.
Figure 11:
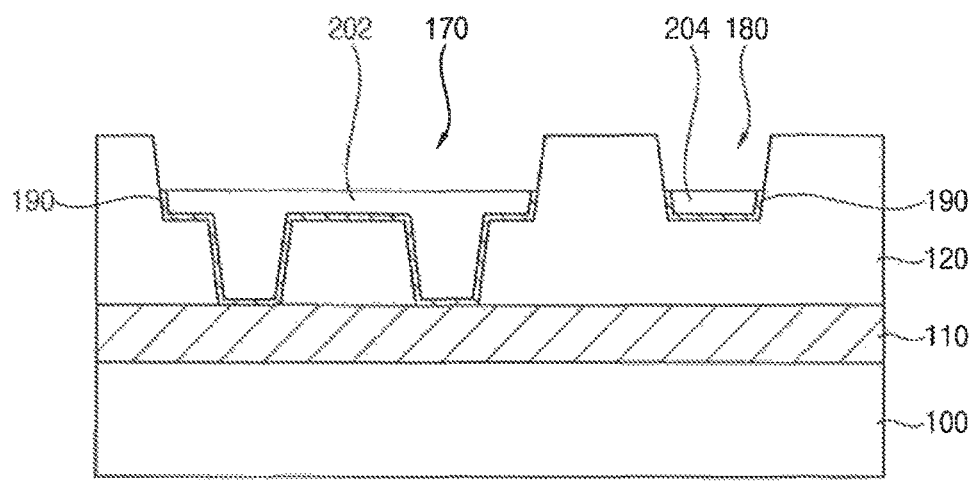
Figure 12:
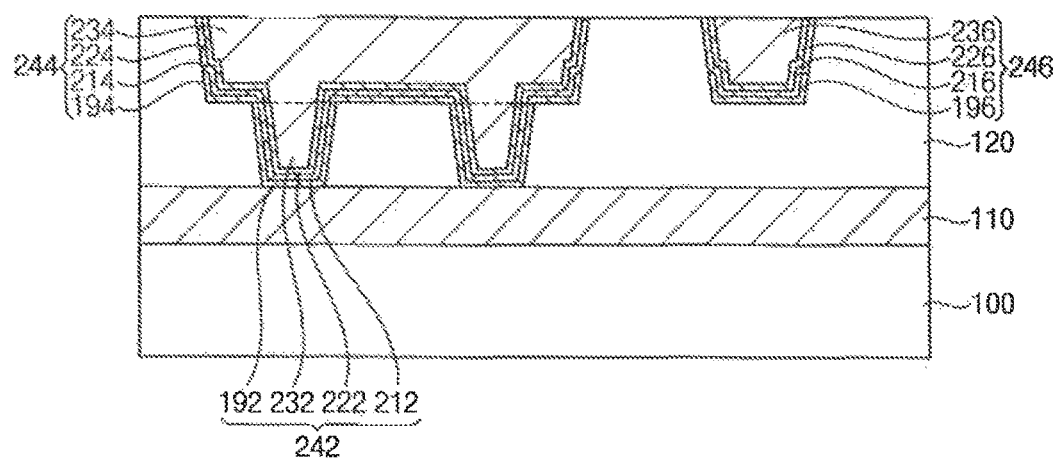

FIGS. 10 to 12 are cross-sectional views illustrating a method of manufacturing a semiconductor device according to an exemplary embodiment of the present inventive concept. The method may include processes substantially the same as or similar to those illustrated with reference to FIGS. 1 to 7, and detailed descriptions thereof may be omitted.

Processes substantially the same as or similar to those illustrated with reference to FIGS. 1 to 3 may be performed.

Referring to FIG. 10, processes substantially the same as or similar to those illustrated with reference to FIG. 4 may be performed. However, the sacrificial layer 200 may be removed such that upper surfaces of the first and second sacrificial patterns 202 and 204 may be lower than an upper surface of the second insulating interlayer 120 and higher than the lower surfaces of the first and second trenches 170 and 180.

Referring to FIG. 11, processes substantially the same as or similar to those illustrated with reference to FIG. 5 may be performed.

Thus, the exposed upper portion of the protection layer 190 and the first mask 130 may be removed. A portion of the protection layer 190 covering the first mask 130 may be removed. Portions of the protection layer 190 on upper sidewalk of the first and second trenches 170 and 180 may also be removed.

Referring to FIG. 12, processes substantially the same as or similar to those illustrated with reference to FIGS. 6 and 7 may be performed to manufacture the semiconductor device according to an exemplary embodiment of the present inventive concept.

In the semiconductor device, the second protection pattern 194 may be formed on a portion of the lower surface of the first trench 170 and a portion, e.g., a lower portion of the sidewall of the first trench 170. The third protection pattern 196 may be formed on a portion of the lower surface of the second trench 180 and a portion, e.g., a lower portion of the sidewall of the second trench 180. Thus, the second barrier pattern 214 may be formed on a remaining portion, e.g., an upper portion of the sidewall of the first trench 170, and the third barrier pattern 216 may be formed on a remaining portion, e.g., an upper portion of the sidewall of the second trench 180.

Figure 13:
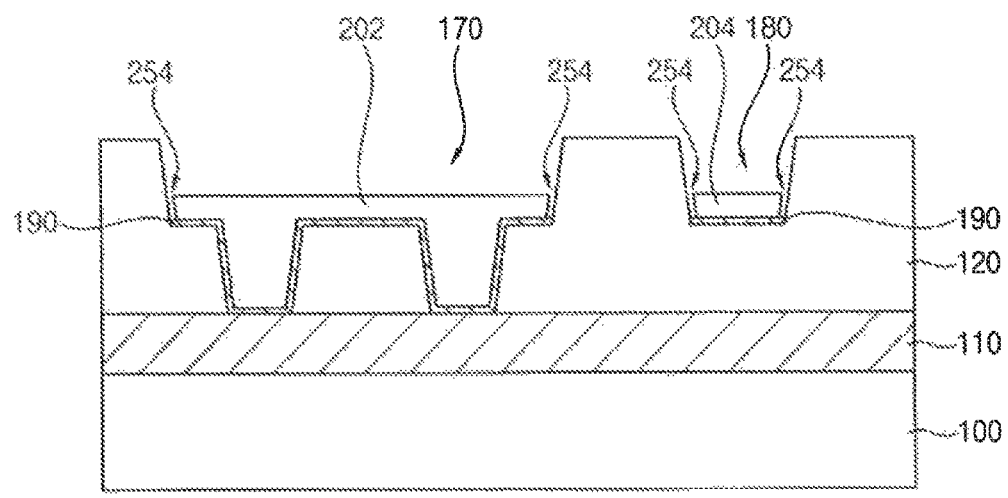
FIGS. 13 and 14 are cross-sectional views illustrating a method of manufacturing a semiconductor device according to an exemplary embodiment of the present inventive concept.
Figure 14:
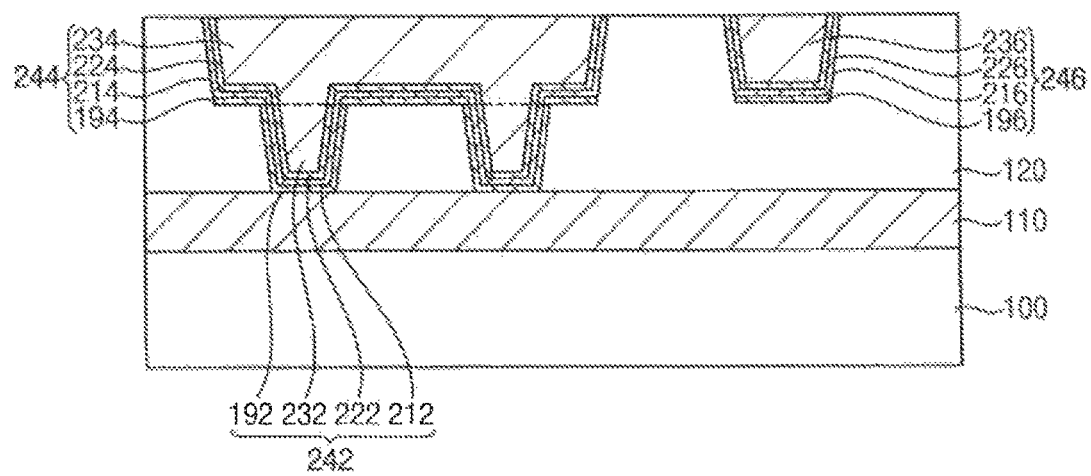

FIGS. 13 and 14 are cross-sectional views illustrating a method of manufacturing a semiconductor device according to an exemplary embodiment of the present inventive concept. The method may include processes substantially the same as or similar to those illustrated with reference to FIGS. 10 to 12, and detailed descriptions thereof may be omitted.

Processes substantially the same as or similar to those illustrated with reference to FIG. 10 may be performed.

Referring to FIG. 13, processes substantially the same as or similar to those illustrated with reference to FIG. 11 may be performed. That is, when the first mask 130 and the upper portion of the protection layer 190 are removed, a portion of the protection layer 190 adjacent upper surfaces of the first and second sacrificial patterns 202 and 204 may be further removed. Thus, an upper surface of the protection layer 190 may be lower than upper surfaces of the first and second sacrificial patterns 202 and 204. Accordingly, the second and third recesses 252 and 254 may be formed adjacent upper portions of the first and second sacrificial patterns 202 and 204, respectively.

According to an exemplary embodiment of the present inventive concept, the protection layer 190 may be formed on the lower surface and the sidewall of the via hole 160, and portions of the lower surfaces of the first and second trenches 170 and 180.

Referring to FIG. 14, processes substantially the same as or similar to those illustrated with reference to FIG. 12 may be performed to manufacture the semiconductor device according to an exemplary embodiment of the present inventive concept.

In the semiconductor device, the second protection pattern 194 may be formed on only a portion of the lower surface of the first trench 170. The third protection pattern 196 may be formed only on the lower surface of the second trench 180. Thus, the second and third barrier patterns 214 and 216 may be formed on sidewalls of the first and second trenches 170 and 180, respectively.

Figure 15:
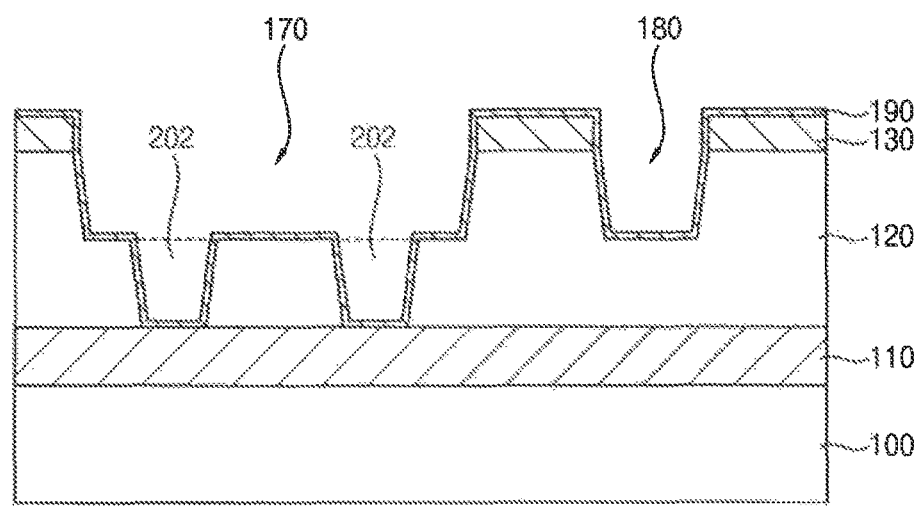
FIGS. 15 and 16 are cross-sectional views illustrating a method of manufacturing a semiconductor device according to an exemplary embodiment of the present inventive concept.
Figure 16:
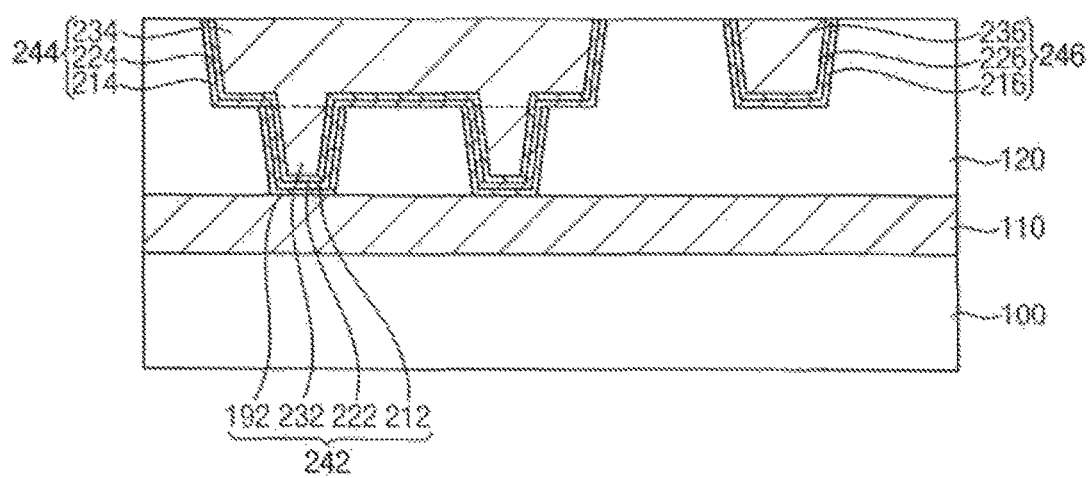

FIGS. 15 and 16 are cross-sectional views illustrating a method of manufacturing a semiconductor device according to an exemplary embodiment of the present inventive concept. The method may include processes substantially the same as or similar to those illustrated with reference to FIGS. 1 to 7, and detailed descriptions thereof may be omitted.

Processes substantially the same as or similar to those illustrated with reference to FIGS. 1 to 3 may be performed.

Referring to FIG. 15, processes substantially the same as or similar to those illustrated with reference to FIG. 4 may be performed. However, the sacrificial layer 200 may be removed such that upper surfaces of the first and second sacrificial patterns 202 and 204 may be substantially coplanar with the lower surfaces of the first and second trenches 170 and 180.

Referring to FIG. 16, process substantially the same as or similar to that illustrated with reference to FIGS. 5 to 7 may be performed to manufacture the semiconductor device according to an exemplary embodiment of the present inventive concept.

In the semiconductor device, the second and third wirings 244 and 246 tight not include second and third protection patterns, respectively. That is, the second wiring 244 may include the second barrier pattern 214, the second adhesion pattern 224, and the second conductive pattern 234 sequentially stacked in the first trench 170. The third wiring 246 may include the third barrier pattern 216, the third adhesion pattern 226, and the third conductive pattern 236 sequentially stacked in the second trench 180.

The second barrier pattern 214 may be formed on a portion of the lower surface and the sidewall of the first trench 170. The third barrier pattern 216 may be formed on the lower surface and the sidewall of the second trench 180.

Figure 17:
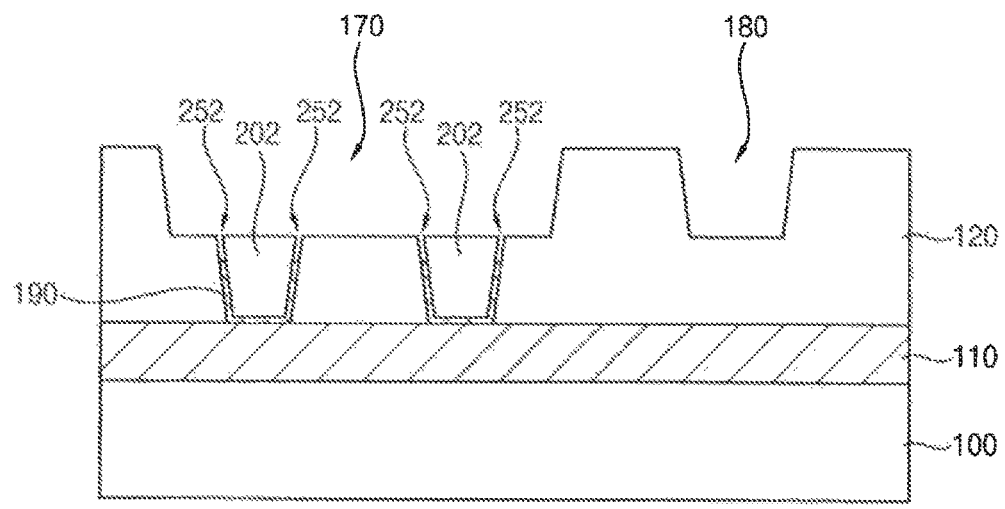
FIGS. 17 and 18 are cross-sectional views illustrating a method of manufacturing a semiconductor device according to an exemplary embodiment of the present inventive concept.
Figure 18:
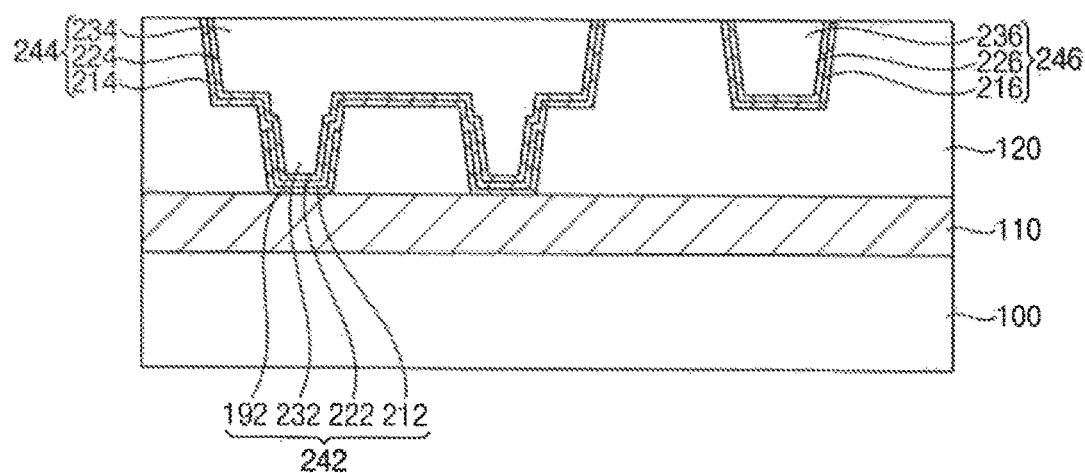

FIGS. 17 and 18 are cross-sectional views illustrating a method of manufacturing a semiconductor device according to an exemplary embodiment of the present inventive concept. The method may include processes substantially the same as or similar to those illustrated with reference to FIGS. 15 and 16, and detailed descriptions thereof may be omitted.

Processes substantially the same as or similar to those illustrated with reference to FIG. 15 may be performed.

Referring to FIG. 17, processes substantially the same as or similar to those illustrated with reference to FIG. 5 may be performed. That is, when the first mask 130 and the upper portion of the protection layer 190 are removed, a portion of the protection layer 190 adjacent the upper surfaces of the first and second sacrificial patterns 202 and 204 may be further removed. Thus, the upper surface of the protection layer 190 may be lower than upper surfaces of the first and second sacrificial patterns 202 and 204. Accordingly, the second and third recesses 252 and 254 may be formed adjacent upper portions of the first and second sacrificial patterns 202 and 204, respectively.

According to an exemplary embodiment of the present inventive concept, the protection layer 190 may be formed on the lower surface and a portion of the sidewall of the via hole 160, e.g., other portions of the sidewall except for the upper portion thereof.

Referring to FIG. 18, processes substantially the same as or similar to those illustrated with reference to FIG. 16 may be performed to manufacture the semiconductor device according to an exemplary embodiment of the present inventive concept.

In the semiconductor device, the first protection pattern 192 may be formed only on the lower surface and other portions except for the upper portion of the sidewall of the via hole 160. The first barrier pattern 212 may be formed on the upper portion of the sidewall of the via hole 160.

The above semiconductor device may be applied to various types of memory devices including wiring structures. For example, the semiconductor device may be applied to wiring structures of logic devices such as central processing units (CPUs), main processing units (MPUs), application processors (APs), or the like. Additionally, the semiconductor device may be applied to wirings in peripheral regions or cell regions of volatile memory devices such as dynamic random-access memory (DRAM) devices or static random-access memory (SRAM) devices, or wiring structures of non-volatile memory devices such as flash memory devices, phase-change memory (PRAM) devices, magnetoresistive random-access memory (MRAM) devices, resistive random-access (RRAM) devices, or the like.

The foregoing is illustrative of exemplary embodiments of the present inventive concept and is not to be construed as limiting thereof. Although several exemplary embodiments of the present inventive concept have been described, those skilled in the art will readily appreciate that many modifications are possible in the exemplary embodiments without materially departing from the spirit or scope of the present inventive concept. Accordingly, all such modifications are intended to be included within the scope of the present inventive concept as defined in the following claims.

What is claimed is:

1. A semiconductor device, comprising:
an insulating interlayer disposed on a substrate, the insulating interlayer having a via hole and a first trench, the via hole extending through a lower portion of the insulating interlayer, and the first trench connected to the via hole and extending through an upper portion of the insulating interlayer;
a first protection pattern covering a lower surface and sidewalls of the via hole and a portion of a lower surface and a lower sidewall of the first trench, the first protection pattern including a conductive material;
a first barrier pattern covering the protection pattern and directly contacting an upper sidewall of the first trench;
a first adhesion pattern covering the first barrier pattern; and
a first conductive pattern disposed on the first adhesion pattern, the first conductive pattern filling the via hole and the first trench.

2. The semiconductor device of claim 1, wherein the first protection pattern includes a first metal nitride, the first barrier pattern includes a second metal nitride, the first adhesion pattern includes a first metal, and the first conductive pattern includes a second metal.

3. The semiconductor device of claim 2, wherein the first metal nitride includes titanium nitride or manganese nitride, the second metal nitride includes tantalum nitride, the first metal includes cobalt or ruthenium, and the second metal includes copper or aluminum.

4. The semiconductor device of claim 1, wherein a wiring is disposed below the first protection pattern on the lower surface of the via hole.

5. The semiconductor device of claim 1, wherein the insulating interlayer further includes a second trench extending through an upper portion of the insulating interlayer, the second trench spaced apart from the first trench,
and wherein the semiconductor device further comprises:
a second protection pattern covering a lower surface and a lower sidewall of the second trench;
a second barrier pattern covering the second protection pattern and an upper sidewall of the second trench;
a second adhesion pattern covering the second barrier pattern; and
a second conductive pattern disposed on the second adhesion pattern, the second conductive pattern filling the second trench.

6. The semiconductor device of claim 5, wherein the second protection pattern, the second barrier pattern, the second adhesion pattern, and the second conductive pattern each include substantially the same materials as those of the first protection pattern, the first barrier pattern, the first adhesion pattern, and the first conductive pattern, respectively.

7. The semiconductor device of claim 1, wherein the insulating interlayer includes two via holes connected to the first trench,
and wherein the first protection pattern, the first barrier pattern, the first adhesion pattern, and the first conductive pattern are sequentially stacked on the lower surface of the first trench between the two via holes.

8. A semiconductor device, comprising:
a first wiring structure including:
a first barrier pattern;
a first adhesion pattern covering an upper surface of the first barrier pattern;
a first conductive pattern disposed on the first adhesion pattern; and
a first protection pattern covering at least a portion of a lower surface of the first barrier pattern, the first protection pattern including a conductive material; and
a second wiring structure including:
a second barrier pattern;
a second adhesion pattern covering an upper surface of the second barrier pattern;
a second conductive pattern disposed on the second adhesion pattern,
wherein a lower surface and a sidewall of the first conductive pattern and the second conductive pattern is covered by the first adhesion pattern and the second adhesion pattern, respectively,
wherein a lower surface of the first wiring structure is lower than a lower surface of the second wiring structure, and an upper surface of the first wiring structure is substantially coplanar with an upper surface of the second wiring structure,
wherein the first conductive pattern includes a lower portion and an upper portion, the lower portion having a first width, and the upper portion having a second width greater than the first width,
wherein the first protection pattern covers a portion of the lower surface of the first barrier pattern corresponding to a portion of the lower portion of the first conductive pattern, and
wherein a lower surface and a sidewall of the second barrier pattern are not covered by a second protection pattern including a conductive material.

9. The semiconductor device of claim 8, wherein the first and second barrier patterns include substantially the same material, the first and second adhesion patterns include substantially the same material, and the first and second conductive patterns include substantially the same material.

10. The semiconductor device of claim 9, wherein the first protection pattern includes a first metal nitride, the first and second barrier patterns include a second metal nitride, the first and second adhesion patterns include a first metal, and the first and second conductive patterns include a second metal.

11. The semiconductor device of claim 10, wherein the first metal nitride includes titanium nitride or manganese nitride, the second metal nitride includes tantalum nitride, the first metal includes cobalt or ruthenium, and the second metal includes copper or aluminum.

12. The semiconductor device of claim 8,
wherein the first protection pattern covers a portion of the lower surface of the first barrier pattern corresponding to a lower surface and a lower sidewall of the upper portion of the first conductive pattern.

13. A semiconductor device, comprising:
a substrate;
an insulating interlayer disposed on the substrate, the insulating interlayer including first and second via holes that are adjacent to each other, and first and second trenches;
a protection pattern disposed on the insulating interlayer, the protection pattern including a conductive material and covering a surface of the insulating interlayer;
a barrier pattern disposed on the protection pattern;
an adhesion pattern disposed on the barrier pattern; and
a conductive pattern disposed on the adhesion pattern, wherein
each of the first and second via holes extends through a lower portion of the insulating interlayer, and the first and second trenches extend through an upper portion of the insulating interlayer, and
the conductive pattern fills the first and second via holes and the first and second trenches,
wherein the semiconductor device further comprises: a wiring disposed directly below the protection pattern on a lower surface of each of the first and second via holes.

14. The semiconductor device of claim 13, wherein the protection pattern includes a first metal nitride, the barrier pattern includes a second metal nitride, the adhesion pattern includes a first metal, and the conductive pattern includes a second metal.

15. The semiconductor device of claim 14, wherein the first metal nitride includes titanium nitride or manganese nitride, the second metal nitride includes tantalum nitride, the first metal includes cobalt or ruthenium, and the second metal includes copper or aluminum.

* * * * *